(12) United States Patent
Adkisson et al.

(10) Patent No.: US 8,168,474 B1
(45) Date of Patent: May 1, 2012

(54) SELF-DICING CHIPS USING THROUGH SILICON VIAS

(75) Inventors: James W. Adkisson, Jericho, VT (US); Panglijen Candra, Williston City, VT (US); Thomas J. Dunbar, Burlington, VT (US); Jeffrey P. Gambino, Westford, VT (US); Mark D. Jaffe, Shelburne, VT (US); Robert K. Leidy, Burlington, VT (US); Yen L. Lim, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/987,402

(22) Filed: Jan. 10, 2011

(51) Int. Cl.
*H01L 21/00* (2006.01)
(52) U.S. Cl. ........ 438/113; 438/106; 438/107; 438/460; 257/E21.001
(58) Field of Classification Search .................. 438/113, 438/114; 257/E21.001
See application file for complete search history.

(56) References Cited

U.S. PATENT DOCUMENTS

| | | | |
|---|---|---|---|
| 3,997,964 | A | 12/1976 | Holbrook et al. |
| 4,138,304 | A | 2/1979 | Gantley |
| 4,236,296 | A | 12/1980 | Woolhouse et al. |
| 4,285,433 | A | 8/1981 | Garrett, Sr. et al. |
| 5,426,058 | A * | 6/1995 | Nakai et al. .............. 438/68 |
| 5,824,595 | A | 10/1998 | Igel et al. |
| 6,107,164 | A | 8/2000 | Ohuchi |
| 6,316,328 | B1 * | 11/2001 | Komuro .............. 438/401 |
| 6,521,485 | B2 * | 2/2003 | Su et al. .............. 438/114 |
| 6,528,393 | B2 | 3/2003 | Tao |
| 6,693,361 | B1 | 2/2004 | Siniaguine et al. |
| 7,112,470 | B2 | 9/2006 | Daubenspeck et al. |
| 7,129,114 | B2 | 10/2006 | Akram |
| 7,199,449 | B2 | 4/2007 | Lake |
| 7,316,940 | B2 | 1/2008 | Daubenspeck et al. |
| 7,569,421 | B2 | 8/2009 | Do et al. |
| 7,585,750 | B2 | 9/2009 | Do et al. |
| 7,622,365 | B2 | 11/2009 | Parekh |
| 7,648,900 | B2 | 1/2010 | Kirby |
| 7,741,156 | B2 | 6/2010 | Pagaila et al. |
| 2001/0001215 | A1 | 5/2001 | Siniaguine et al. |
| 2002/0013061 | A1 | 1/2002 | Siniaguine et al. |
| 2004/0259329 | A1 | 12/2004 | Boyle et al. |
| 2007/0221613 | A1 | 9/2007 | Gutsche et al. |
| 2007/0264753 | A1 * | 11/2007 | Tomita et al. ............ 438/113 |
| 2007/0275541 | A1 | 11/2007 | Harris et al. |

(Continued)

OTHER PUBLICATIONS

Daubenspeck et al., U.S. Appl. No. 12/423,254, "Process for Wet Singulation Using a Dicing Singulation Structure," Apr. 14, 2009.
Kumagai et al., "Advanced Dicing Technology for Semiconductor Wafer-Stealth Dicin," IEEE Transactions on Semiconductor Manufacturing, vol. 20, No. 3, Aug. 2007, pp. 259-265.

*Primary Examiner* — Angel Roman
(74) *Attorney, Agent, or Firm* — Gibb I.P. Law Firm, LLC; Anthony J. Canale

(57) ABSTRACT

Systems and methods simultaneously form first openings and second openings in a substrate. The first openings are formed smaller than the second openings. The method also simultaneously forms a first material in the first openings and the second openings. The first material fills the first openings, and the first material lines the second openings. The method forms a second material different than the first material in the second openings. The second material fills the second openings. The method forms a plurality of integrated circuit structures over the first material and the second material within the second openings. The method applies mechanical stress to the substrate to cause the substrate to split along the first openings.

18 Claims, 4 Drawing Sheets

U.S. PATENT DOCUMENTS

2009/0061595 A1* 3/2009 Weber et al. .................. 438/460
2010/0261335 A1* 10/2010 Andry et al. .................. 438/462

* cited by examiner

US 8,168,474 B1

SELF-DICING CHIPS USING THROUGH SILICON VIAS

BACKGROUND

The present invention relates to dividing a silicon wafer into chips, and more specifically, to structures and methods that divide a silicon wafer into chips by using openings (through silicon vias) along borders of the chip.

Integrated circuit structures are sometimes manufactured in mass on silicon wafers to achieve manufacturing efficiencies. Once the integrated circuit structures are complete, the wafers are divided into segments that are commonly referred to as chips.

There are many different methods used to separate the wafers into such chips. For example, the wafers can be cut (using a diamond saw, etc.) or the wafers can be etched and cracked. However, such methods can damage the chips, decreasing the yield.

SUMMARY

In order to address such issues, one method embodiment of the present invention simultaneously forms first openings and second openings in a substrate. The first openings are formed smaller than the second openings. The method also simultaneously forms a first material in the first openings and the second openings. The first material fills the first openings, and the first material lines the second openings. The method forms a second material different than the first material in the remainder of second openings. The second material fills the second openings. The method forms a plurality of integrated circuit structures over the first material and the second material within the second openings. A variety of techniques can be implemented to induce the final desired "break'" along the line of first openings. This could be temperature differences, heat/cold, or mechanical stresses, tension/shear/complex stresses, such as vacuum on a spherical chuck, concave surface pressure/vacuum, etc.

An alternative method embodiment herein simultaneously forms first openings and second openings in a silicon substrate. The first openings are formed smaller than the second openings. The method simultaneously forms a first material in the first openings and the second openings. The first material fills the first openings, and the first material lines the second openings. The method forms a second material different than the first material in the second openings. The second material fills the second openings. The method forms a plurality of integrated circuit structures over the first material and the second material within the second openings. The method removes a portion of the silicon substrate to expose the first openings and the second openings and causes the silicon substrate to split along the first openings.

An additional method embodiment herein simultaneously forms first openings and second openings in a silicon substrate. The first openings are formed smaller than the second openings. The method simultaneously forms a first material in the first openings and the second openings. The first material fills the first openings, and the first material lines the second openings. The method forms a second material different than the first material in the second openings. The second material fills the second openings. The method forms a plurality of integrated circuit structures over the first material and the second material within the second openings. The method also forms a packaging material over the integrated circuit structures and applies an adhesive layer to the packaging material. The method removes a portion of the silicon substrate to expose the first openings and the second openings and causes the silicon substrate to split along the first openings. The method then removes the diced integrated circuit structures from the adhesive layer.

An integrated circuit chip embodiment herein includes a chip silicon substrate having a border, an integrated circuit structure on the chip silicon substrate, and a packaging material over the integrated circuit structure. First through silicon vias extend along the border of the chip silicon substrate. The first through silicon vias are filled with a first material. Second through silicon vias extend into the chip silicon substrate from the integrated circuit structure. The second through silicon vias are filled with the first material and a second material, different than the first material.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

As mentioned above, some methods of dicing a wafer apply mechanical stress to the wafer in order to separate the wafer into chips. However, this can cause the wafer to crack in undesirable areas. In one example, the areas where through silicon vias (TSV) are formed within the substrate, weakens the substrate. Therefore, undesirable cracks are sometimes found extending into the substrate from the through silicon vias.

In order to address such undesirable splitting or cracking, the embodiments herein form patterns of openings (TSVs) around the area to be separated (in the dicing channel) on the substrate. These openings facilitate dicing of integrated circuit (IC) chips formed upon the substrate.

With embodiments herein, the dicing through silicon via structures (in the dicing channel) are different than the electrical through silicon vias structures (connected to the integrated circuit structures). The dicing vias are narrower, closer together, more linear, etc., than the electrical vias, and the dicing vias are filled with a different mixture of materials (e.g., oxide ands polysilicon) than the electrical vias (e.g., filled with metal) so that a strength of the dicing vias is lower than the strength of the electrical chip vias. In some cases and designs, the strength of electrical vias may actually be stronger than dicing vias. However, through placement in regards to crystalline structure, or sheer number of dicing vias in a particular area, the net overall effect of the dicing vias will be of weakness when compared to electrical vias.

Therefore, the embodiments herein form special types of through silicon vias in the dicing channel that are weaker, smaller, and patterned closer together than the normal through silicon vias that form electrical connections to the integrated circuits of the chip. When physical stress is applied to the wafer, the special dicing through silicon vias structurally fail before the electrical through silicon vias fail, thereby helping to promote a split along the dicing channel, and preventing splits from occurring near the electrical through silicon vias. The embodiments herein can form the dicing through silicon vias to define shapes that are larger than conventional integrated circuit chips (such as stitched arrays) and the size and pattern of the perforations formed by the first openings is essentially unlimited, and can be used to accomplish any desired division patterns (even potentially allowing an array of elements to be formed to the edge of a chip).

Figure 1:
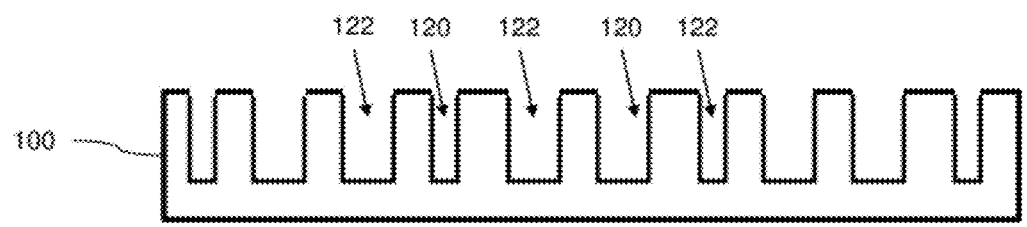
FIG. 1 is a schematic cross-sectional diagram illustrating an exemplary structure according to embodiments herein.

More specifically, as shown in FIG. 1, various embodiments herein begin by forming first openings 120 and second openings 122 in a silicon substrate 100. A "substrate" herein can comprise any material appropriate for the given purpose (whether now known or developed in the future) and can comprise, for example, silicon, organic structures, etc.

As shown in FIG. 1, the first openings 120 are formed smaller (have a smaller width, smaller cross-section, smaller diameter, smaller radius, or other smaller dimension) than the second openings 122. In this case, by using the term "smaller" it is meant that the first openings 120 may be 10%, 20%, 30%, 50%, 80%, etc., the size of the second openings 122. Note that while FIG. 1 illustrates one pattern of openings, those ordinarily skilled in the art would understand that FIG. 1 is merely utilized for illustration purposes and that many other patterns of openings would be utilized when forming different types of substrates.

In addition, the openings 120, 122 can be formed simultaneously using a single mask, or can be formed sequentially using multiple masks, as would be understood by those ordinarily skilled in the art.

When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Figure 2:
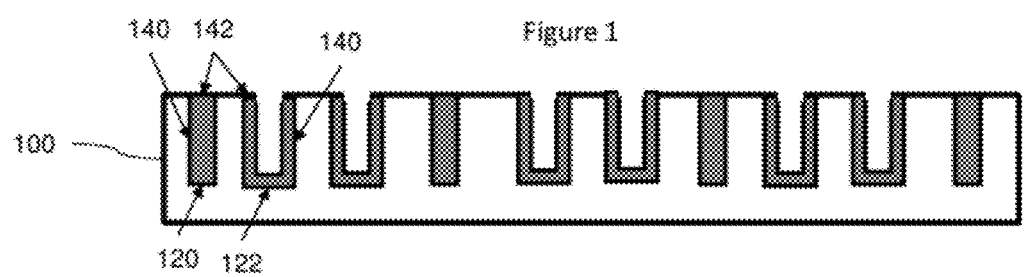
FIG. 2 is a schematic cross-sectional diagram illustrating an exemplary structure according to embodiments herein.

As shown in FIG. 2, all the openings 120, 122 can be lined with some form of liner or insulator 140, such as an oxide or a nitride (silicon oxide, silicon nitride, etc.). Any excess of the liner material 140 can be removed from the top of the substrate 100 if necessary. For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, and metal oxides like tantalum oxide. The thickness of dielectrics herein may vary contingent upon the required device performance.

Additionally, as shown in FIG. 2, the embodiments herein simultaneously form (deposit, grow, place, etc.) a first material 142 in the first openings 120 and the second openings 122 over the liner material 140. The first material 142 can be similar to the liner material 140 or can be different and comprises, for example, a conductor such as polysilicon, an insulator such as an oxide or a nitride, etc. The amount of first material 142 formed is controlled so that (because of the size difference between the openings) the first material 142 completely fills the first openings 120, but the first material 142 does not completely fill the second openings 122. Instead, the first material merely lines the second openings 122. Any excess of the first material 142 can be removed from the top of the substrate 100 if necessary.

Figure 3:
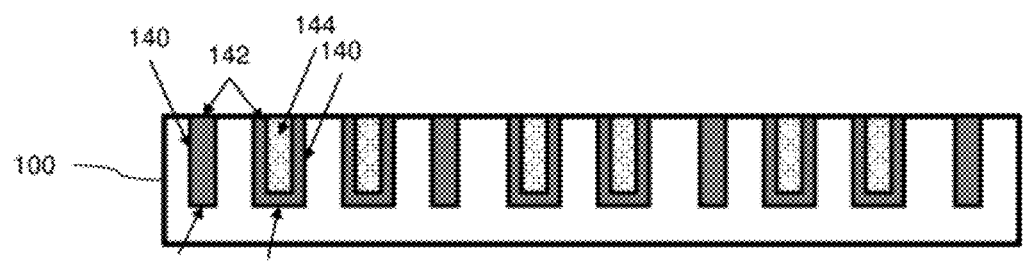
FIG. 3 is a schematic cross-sectional diagram illustrating an exemplary structure according to embodiments herein.

The embodiments herein then form a second material 144 different than the first material 142 in the remainder of the second openings 122, as shown in FIG. 3. The second material 144 is formed in sufficient quantities to completely fill the second openings 122. The first material 142 and the second material 144 can comprise any materials suitable for any given structures design; however, with embodiments herein the first material 142 may have a lower strength measure than the second material 144. For example, the second material can comprise a metal or alloy (such as tungsten, hafnium, tantalum, molybdenum, titanium, or nickel, or a metal silicide, any alloys of such metals) and may be deposited using physical vapor deposition, chemical vapor deposition, or any other technique known in the art. Even if the combination of materials in the second openings has the same strength as (or a lower strength than) the combination of materials in the first openings, the relative closeness of the first openings to one another and the linear pattern of the first openings causes the first openings to fracture with less force than that required to fracture the second openings.

Figure 4:
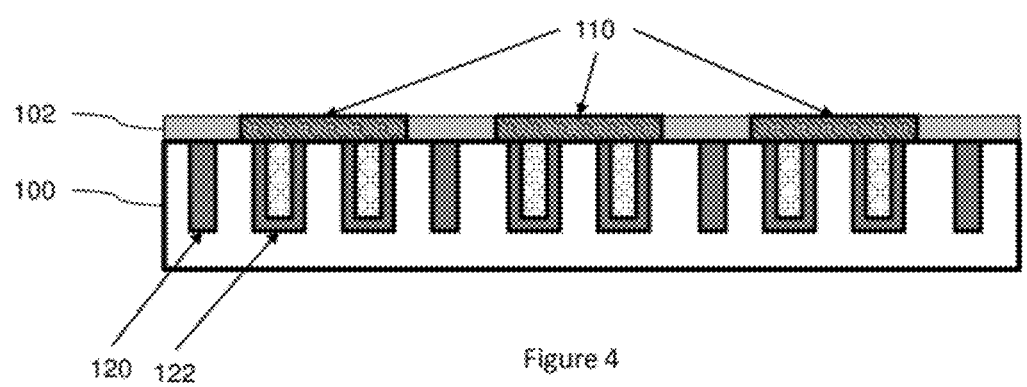
FIG. 4 is a schematic cross-sectional diagram illustrating an exemplary structure according to embodiments herein.

The method forms a plurality of integrated circuit structures 110 over the first material 142 and the second material 144 within the second openings 122, within insulator layer 102 (as shown in FIG. 4). The integrated circuit structures 110 can comprise any form of solid-state structure, including processors, memories, power converters, etc., which are well known to those ordinarily skilled in the art. Generally, transistor structures which may be included in the integrated structures 110 are formed by depositing or implanting impurities into a substrate to form conductive and semiconductor regions, bordered by shallow trench isolation regions. As shown in FIG. 4, the through silicon via structures within the second openings 122 form conductive contacts to the integrated circuit structures 110 to allow signals, voltage, current, etc., to flow to and from the integrated circuit structures 110.

Figure 5:
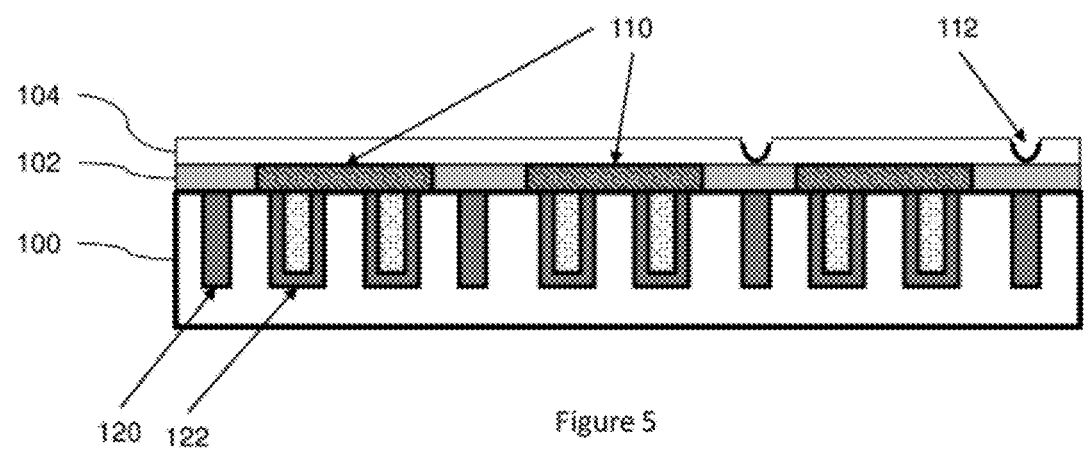
FIG. 5 is a schematic cross-sectional diagram illustrating an exemplary structure according to embodiments herein.

The method can also form a packaging material 104 (such as an insulator, hard material (oxide, nitride, etc.)) over the integrated circuit structures 110 to protect the integrated circuit structures 110, as shown in FIG. 5. FIG. 5 also illustrates optional dicing recesses (channels) 112 that can be formed within the packaging material 104 in order to encourage the wafer to split properly into integrated circuit chips.

Figure 6:
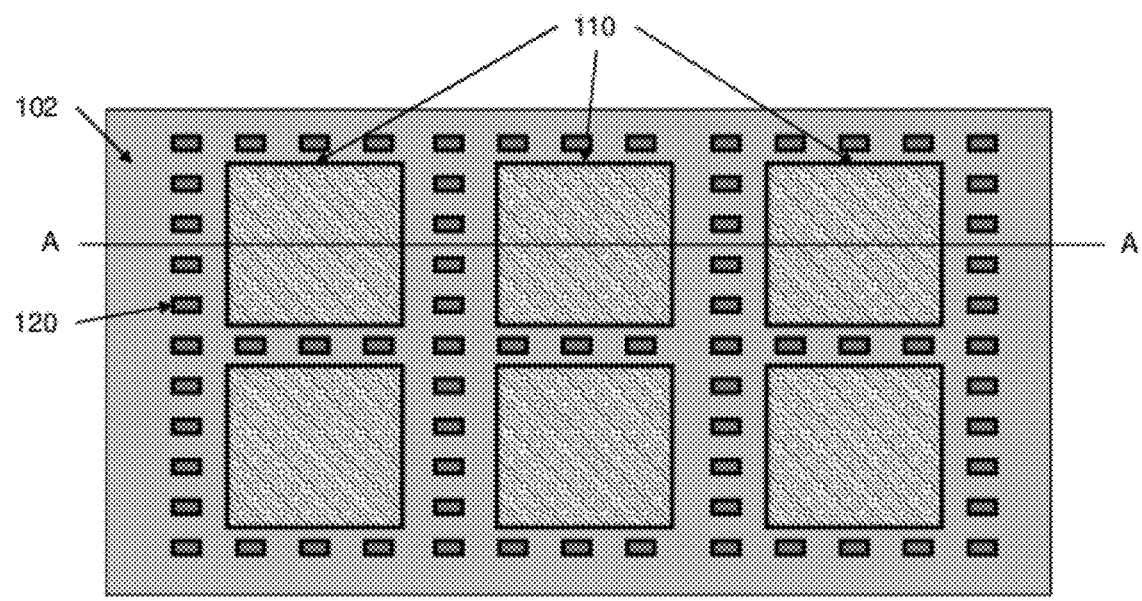
FIG. 6 is a schematic top-view diagram illustrating an exemplary structure according to embodiments herein.

FIG. 6 illustrates the same structure from the top view (but does not illustrate the packaging layer 104) and the cross-sectional drawings herein are drawn along the cross-section line A-A shown in FIG. 6. As shown in FIG. 6, the dicing through silicon vias within the first openings 120 are patterned so as to cause the substrate 100 to have weak areas between the various integrated circuit structures 100. Applied temperature differences (heat/cold) or mechanical stresses, tension/shear/complex stresses, such as vacuum on a spherical chuck, concave surface pressure/vacuum, etc., cause the substrate 102 break or crack along the pattern of first openings 120. Again, because of the relative difference in strength, the dicing through silicon vias within the first openings 120 will break before the stronger electrical through silicon vias within the second openings 122 break.

Figure 7:
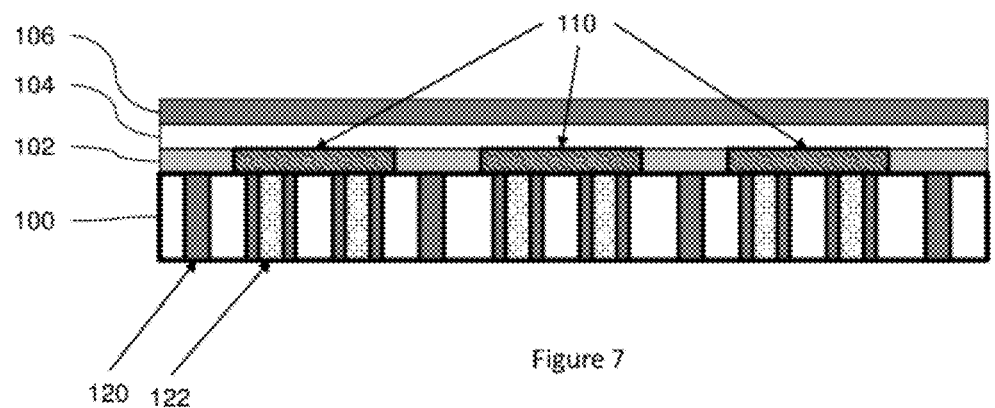
FIG. 7 is a schematic cross-sectional diagram illustrating an exemplary structure according to embodiments herein.

As shown in FIG. 7, the embodiments herein can then optionally apply an adhesive layer 106 to the packaging material 104. Further, as shown in FIG. 7, the method can optionally remove a portion of the silicon substrate 100 to expose the first openings 120 and the second openings 122. This process can involve grinding, polishing, etching, etc., and exposes the first and second materials 120, 122 along the bottom of the substrate 100.

Figure 8:
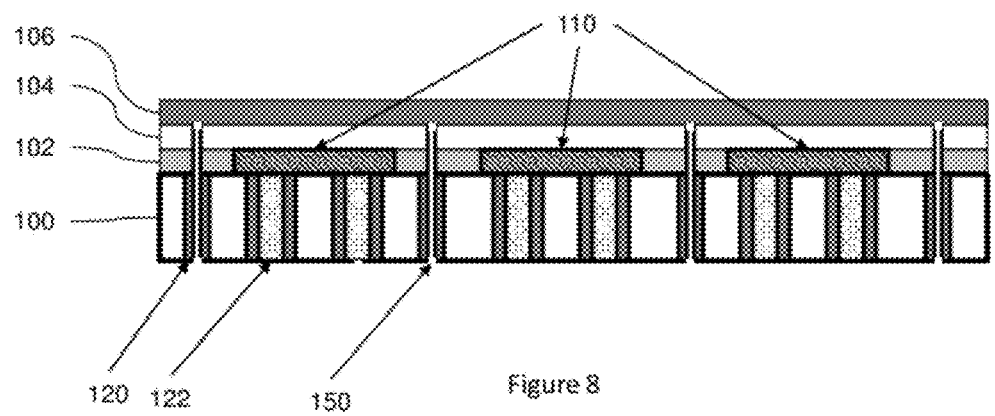
FIG. 8 is a schematic cross-sectional diagram illustrating an exemplary structure according to embodiments herein.

Next, the embodiments herein cause the silicon substrate 100 to split along the first openings 120. The mechanical stress can be applied using many different processes, including: using a vacuum chucking wafer on any type surface (concave most likely, mechanical shock induced dicing); using a rolling pin on different type of surfaces (mechanical shock induced dicing, possibly less uniform vs. vacuum chucking); utilizing surface geometries (concave, or other); relying upon coefficient of thermal expansion differences during heating or cooling cycles, above or below room temperature, to induce a physical force on differing materials thus leading to breakage initialization. These cracks or splits 150 caused by the application of mechanical stress are illustrated in FIG. 8. The application of mechanical stress splits the silicon substrate 100 into integrated circuit chips 112.

Figure 9:
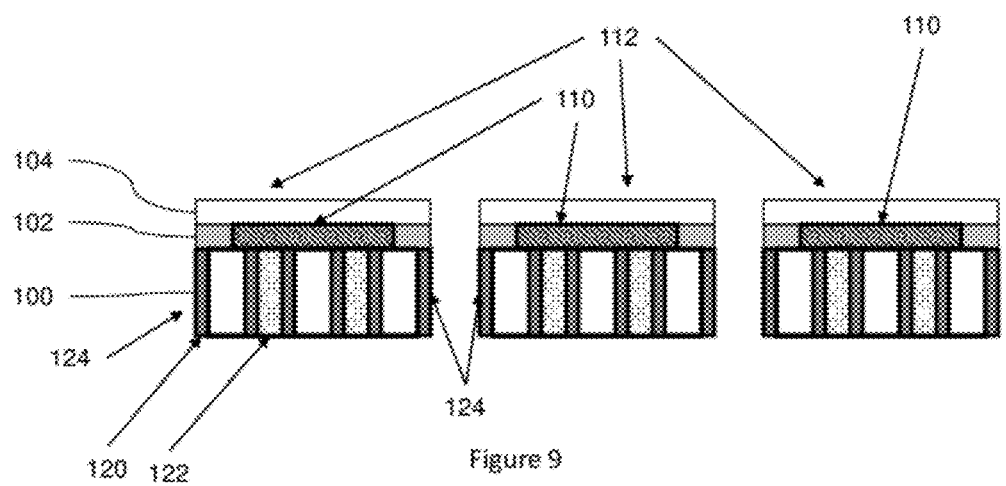
FIG. 9 is a schematic cross-sectional diagram illustrating an exemplary structure according to embodiments herein.
Figure 10:
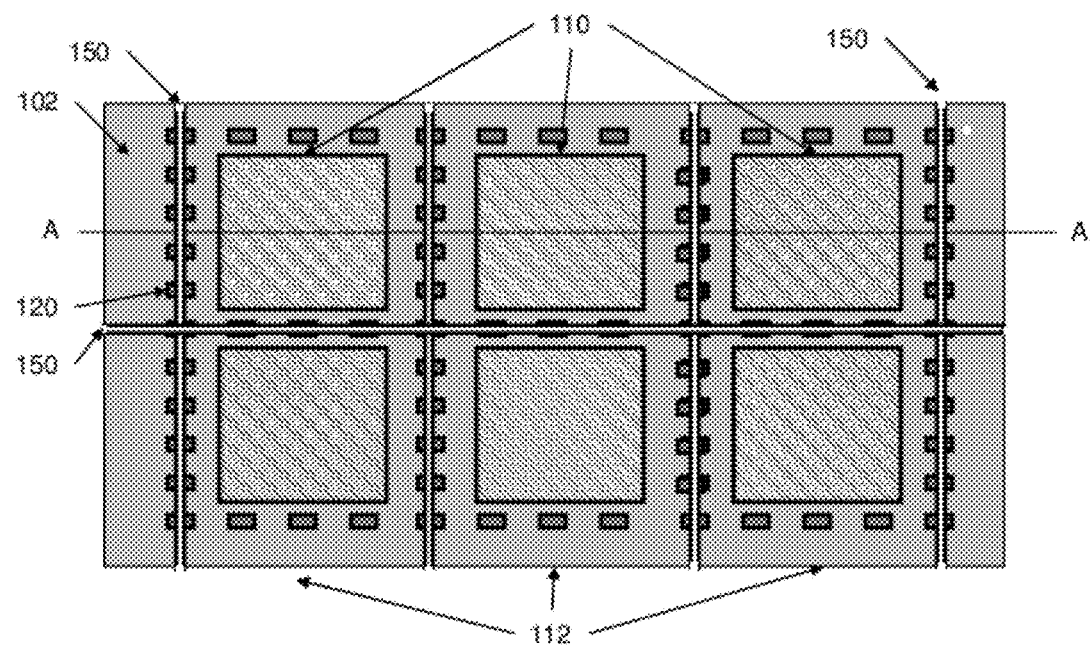
FIG. 10 is a schematic top-view diagram illustrating an exemplary structure according to embodiments herein.

As mentioned above, the first openings 120 can be formed in a linear pattern, (similar to perforations) and the silicon substrate 100 splits along the linear pattern of first openings during the application of the mechanical stress. The method then removes the diced integrated circuit structures 110 from the adhesive layer 106, resulting in individual integrated circuit chips 112, as illustrated in FIG. 9. This division into separate integrated circuit chips is also shown in top-view in FIG. 10.

Thus, as illustrated in FIG. 9, the embodiments herein produce unique integrated circuit chip structures that include a chip silicon substrate 100 having borders 124, an integrated circuit structure 110 on the chip silicon substrate 100, and a packaging material 104 over the integrated circuit structure. With such structures, first through silicon vias 120 extend along the border 124 of the chip silicon substrate 100. The first through silicon vias 120 are filled with the first material 142. Second through silicon vias 122 extend into the chip silicon substrate 100 from the integrated circuit structure 110. The second through silicon vias 122 are filled with the first material 142 and the second material 144.

Figure 11:
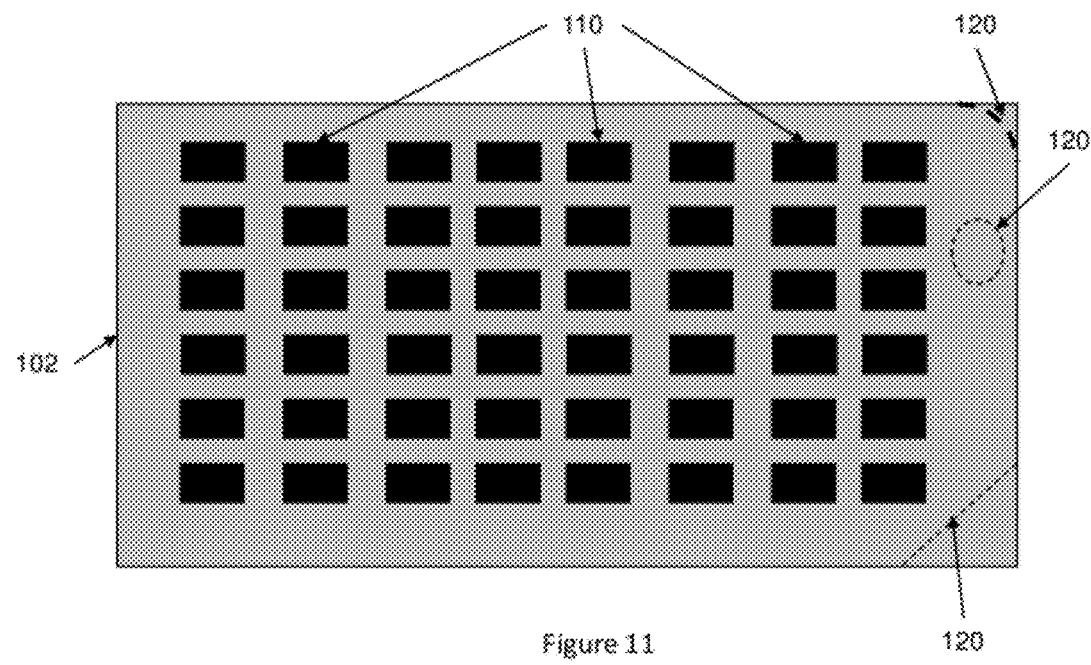
FIG. 11 is a schematic top-view diagram illustrating an exemplary structure according to embodiments herein.

As would be understood by those ordinarily skilled in the art, while a limited number of integrated circuit chips are illustrated in the drawings, actual wafers would include much larger numbers of chips and the drawings are simplified in order to illustrate the operation of the embodiments herein. For example, FIG. 11 illustrates a larger number of integrated circuit chips 110. Additionally, FIG. 11 shows that the pattern of first openings 120 can be at a 45° angle to the borders of the integrated circuit chips 110, can be in a circular pattern to cause an opening to be formed within the substrate 100, can be in an arc shape, triangular, etc., depending upon the specific design goals. Further, the first openings 120 can be patterned into different line types or "perforations" (dotted lines, dashed bars, solid lines in case of cross crystalline structure geometries), into rectangle or square individual hole geometry (to focus purposeful breakage on stress concentrations in corners), etc. Additionally, embodiments herein can form the first openings to define shapes that are larger than conventional integrated circuit chips (such as stitched arrays) and the size and pattern of the perforations formed by the first openings is essentially unlimited, and can be used to accomplish any desired division patterns.

Thus, the patterning of the first openings 120 can be used to leverage smaller dicing spacing and sizing (smaller kerf areas) which allows greater square area for devices, relative to traditional dicing spaces. Further, the first openings 120 allow for an improved location and geometry of where and how dicing can be implemented, thereby potentially allowing the array to go completely to the edge of the chip.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit the invention because, as would be understood by those ordinarily skilled in the art, the invention is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method comprising:
    simultaneously forming first openings and second openings in a substrate, said first openings being formed smaller than said second openings;
    simultaneously forming a first material in said first openings and said second openings, said first material filling said first openings, and said first material lining said second openings;
    forming a second material different than said first material in said second openings, said second material filling said second openings;
    forming a plurality of integrated circuit structures over said first material and said second material within said second openings; and
    causing said substrate to split along said first openings.

2. The method according to claim 1, said first opening being formed closer to one another, relative to spacings between said second openings.

3. The method according to claim 1, said first material comprising an insulator and said second material comprising a conductor.

4. The method according to claim 1, said forming of said first openings forms said first openings in a linear pattern, said substrate splitting along said linear pattern during applying of mechanical stress.

5. The method according to claim 1, mechanical stress splitting said substrate into integrated circuit chips.

6. The method according to claim 1, said first material comprising polysilicon.

7. A method comprising:
    simultaneously forming first openings and second openings in a silicon substrate, said first openings being formed smaller than said second openings;
    simultaneously forming a first material in said first openings and said second openings, said first material filling said first openings, and said first material lining said second openings;
    forming a second material different than said first material in said second openings, said second material filling said second openings;
    forming a plurality of integrated circuit structures over said first material and said second material within said second openings;
    removing a portion of said silicon substrate to expose said first openings and said second openings; and
    causing said silicon substrate to split along said first openings.

8. The method according to claim 7, said first opening being formed closer to one another, relative to spacings between said second openings.

9. The method according to claim 7, said first material comprising an insulator and said second material comprising a conductor.

10. The method according to claim 7, said forming of said first openings forms said first openings in a linear pattern, said silicon substrate splitting along said linear pattern during applying of mechanical stress.

11. The method according to claim 7, mechanical stress splitting said silicon substrate into integrated circuit chips.

12. The method according to claim 7, said first material comprising polysilicon.

13. A method comprising:
    simultaneously forming first openings and second openings in a silicon substrate, said first openings being formed smaller than said second openings;
    simultaneously forming a first material in said first openings and said second openings, said first material filling said first openings, and said first material lining said second openings;
    forming a second material different than said first material in said second openings, said second material filling said second openings;
    forming a plurality of integrated circuit structures over said first material and said second material within said second openings;
    forming a packaging material over said integrated circuit structures;
    applying an adhesive layer to said packaging material;
    removing a portion of said silicon substrate to expose said first openings and said second openings;
    causing said silicon substrate to split along said first openings; and
    removing said integrated circuit structures from said adhesive layer.

14. The method according to claim 13, said first opening being formed closer to one another, relative to spacings between said second openings.

15. The method according to claim 13, said first material comprising an insulator and said second material comprising a conductor.

16. The method according to claim 13, said forming of said first openings forms said first openings in a linear pattern, said silicon substrate splitting along said linear pattern during applying of mechanical stress.

17. The method according to claim 13, mechanical stress splitting said silicon substrate into integrated circuit chips.

18. The method according to claim 13, said first material comprising polysilicon.

* * * * *